Figure 1:
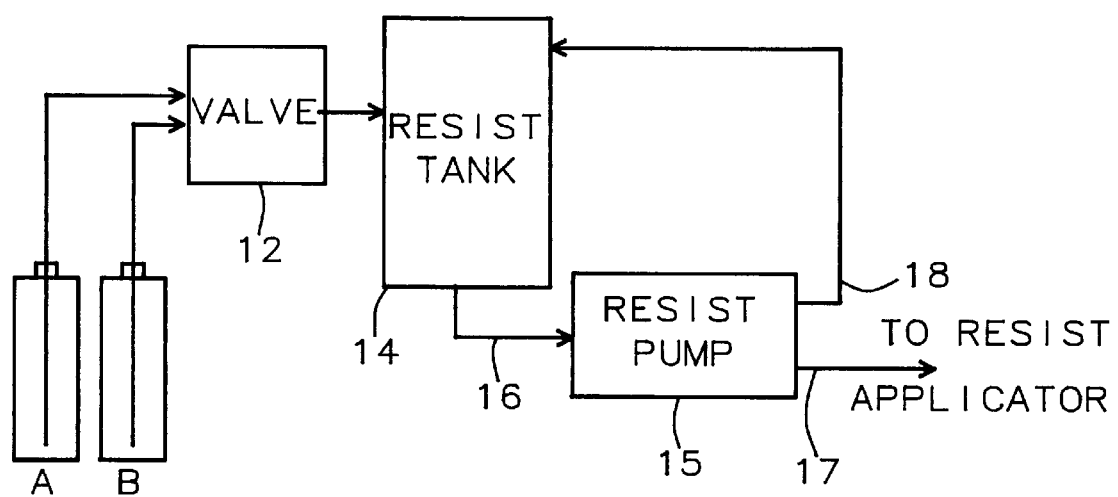

United States Patent [19]
Liu et al.

[11] Patent Number: 5,858,466
[45] Date of Patent: Jan. 12, 1999

[54] PHOTORESIST SUPPLY SYSTEM WITH AIR VENTING

[75] Inventors: Jen Song Liu, Taipei; Bii Juno Chang, Hsin-chu Hsien; Jen Shang Fang, Chin-Chu; Hao Wei Chang, Hsin Chu, all of Taiwan

[73] Assignee: Taiwan Semiconductor Manufacturing Company, Ltd., Hsin-Chu, Taiwan

[21] Appl. No.: 668,792

[22] Filed: Jun. 24, 1996

[51] Int. Cl.$^6$ ................................ B05D 3/00; B05D 1/40
[52] U.S. Cl. ...................... 427/294; 427/345; 427/444; 95/248; 96/194; 118/603; 118/610
[58] Field of Search ..................... 118/603, 610, 118/612; 95/248; 96/194; 427/345, 294, 444; 438/115, 759

[56] References Cited

U.S. PATENT DOCUMENTS

| | | | |
|---|---|---|---|
| 3,345,803 | 10/1967 | Smith | 118/610 |
| 4,115,085 | 9/1978 | Barbe | 118/603 |
| 5,127,362 | 7/1992 | Iwatsu et al. | 118/667 |
| 5,254,367 | 10/1993 | Matsumura et al. | 427/240 |
| 5,601,635 | 2/1997 | Roffelsen | 95/248 |

FOREIGN PATENT DOCUMENTS 213382  9/1986  Japan .

*Primary Examiner*—Brian K. Talbot
*Attorney, Agent, or Firm*—George O. Saile; Stephen B. Ackerman; William S. Robertson

[57] ABSTRACT

A system for pumping resist to a wafer coating machine includes a line that returns a selected proportion of the resist entering the resist pump to the resist supply tank. The return line to the tank is connected to the pump outlet at a higher point than the pump outlet to the wafer coating machine, and the resist that is returned to the tank carries substantially all of the bubbles that are carried in the resist entering the tank. The bubbles are removed from the resist in the tank and the resist can be used normally.

3 Claims, 1 Drawing Sheet

PHOTORESIST SUPPLY SYSTEM WITH AIR VENTING

FIELD OF THE INVENTION

This invention relates generally to the semiconductor manufacturing step of applying photoresist to a wafer. More specifically it relates to a system for supplying photoresist to a machine that applies the photoresist to a wafer and for removing air from the resist.

INTRODUCTION

A photoresist is a material that forms a pattern when it is exposed to radiation. A thin layer of photoresist is spread on the surface of a semiconductor wafer, and the resist is then exposed to a pattern required for a step in the semiconductor manufacturing process. These patterns now have very small details, and there is a well known problem that bubbles in the resist can cause an unsatisfactory image in the exposed resist.

One source of resist bubbles is nitrogen from a sensitizer (diazo-naptho quinone) that is mixed with the resist at one stage of the wafer coating process. It may decompose, and when it does it leaves nitrogen gas. Bubbles may also be present in the resist as it is supplied by its manufacturer.

The resist is applied to a wafer with a machine that applies the resist and then spins the wafer to spread the resist and form a resist coating on the wafer. Resist is held in a tank and is pumped to the wafer coating machines through a piping system.

THE PRIOR ART

Bubbles in resist present a serious problem, and the prior art has attacked this problem in several ways.

In one prior art process, the photoresist is vented at the outlet of a pump to remove the air. Venting has a serious problem that a significant amount of photoresist is wasted. About 20% of the photoresist is dumped to get rid of the air bubbles.

Matsumura U.S. Pat. No. 5,254,367 teaches a resist supply system having a resist supply holder 23 and a piping system that includes a pipe 22 and a valve 22a.

Iwatsu U.S. Pat. No. 5,127,362 teaches a resist supply system having a bottle 6 of resist 7 and a system including a pump 8.

SUMMARY OF THE INVENTION

One object of this invention is to provide a new and improved method for getting rid of air in a photoresist. A more specific object is to avoid the waste of resist in the prior art system that vents the resist at the outlet of the resist pump.

The problem of wasted resist is important because a manufacturer of semiconductor devices can expect to use more and more resist. A more specific reason to avoid wasting resist is that the waste resist has materials that need special treatment. Another more specific reason for avoiding resist waste is that the resist is expensive: a gallon of resist costs several hundred dollars.

In our system, the conventional vent line from the pump outlet is returned to a resist supply tank. We expect that all, or nearly all, of the resist previously lost will be saved (20% of the total resist).

Other objects and features of the invention will appear in the description of a preferred embodiment of the invention.

THE DRAWING

The single figure is a diagram of the resist supply system of the preferred embodiment of this invention.

THE PREFERRED EMBODIMENT

Manufacturers of resist supply the resist in bottles, and the drawing shows two of these bottles, A and B. A valve 12 selects one of the bottles to be fed into a tank 14. One bottle e.g. bottle A is used until it is empty, and the system then automatically switches valve 12 to select the other bottle, B. Bottle A is then replaced with a full bottle. A photoresist pump 15 receives photoresist from tank 14 at an inlet pipe 16 and pumps it to an outlet pipe 17 that lead to conventional machines that apply the resist to wafers.

According to this invention, the pump outlet has a line 18 that returns resist to tank 14 and thereby vents bubbles from the supply system. As the diagram represents, line 18 is connected to the outlet of pump 18 at a physically higher position than line 17. Bubbles rise in the resist, even in the pump, and substantially all of the bubbles are contained in the resist that flows in return line 18.

As the drawing shows, the vent line 18 is preferably returned to the top of the tank, above the level of resist in the tank. From the end of the vent line at the tank, the resist falls back into the tank and the bubbles in the vent line rise to the top of the tank. The tank itself is vented through a commonly used vacuum system that is not shown in the drawing.

The return line 18 preferably carries at least 20% of the pump output (the amount wasted in the prior art), but this amount can be increased to about 30% since the resist that is returned to tank 14 can be used. Line 17 to the resist applying machines carries at least about 70% but not more than about 80% of the resist supplied to pump 15. The relative amounts of resist flowing in lines 17 and 18 is easily established by flow characteristics of lines 17 and 18 and the wafer coating apparatus.

Except for the return line 18 and the percentage of the resist that is diverted to the vent line, the pump, the vent line and the output line are similar to the prior art system describe earlier.

OTHER EMBODIMENTS

From the description of the preferred embodiment of the invention, those skilled in the art will recognize appropriate modifications within the spirit of the invention and the intended scope of the claims.

We claim:

1. A method for supplying resist to an apparatus for applying the resist to a semiconductor wafer comprising, providing a tank for holding the resist and a pump for transferring resist from the tank to the resist applying apparatus, the pump having an inlet from the tank and an outlet to the apparatus for applying the resist, the resist being subject to contamination by bubbles, and venting resist from an outlet position on the pump that is higher than an outlet position for supplying resist to the resist applying apparatus to the tank at a tank position above the resist held in the tank, the resist being vented to the tank containing bubbles, and removing bubbles from the resist in the tank comprising applying a vacuum to the tank, and wherein the step of venting resist from the pump outlet to the tank allows bubbles to be released as the returning resist falls to the level of the resist in the tank, whereby resist vented from the pump outlet and returned to the tank is available for transfer to the resist applying apparatus.

2. The method of claim 1 wherein the amount of resist returned to the tank is controlled to be at least 20% of the resist entering the pump.

3. The method of claim 2 wherein the amount of resist returned to the tank is controlled to be in the range of 20 to 30% of the resist entering the pump.

* * * * *